US012696497B2

(12) United States Patent
Kumada

(10) Patent No.: US 12,696,497 B2
(45) Date of Patent: Jul. 28, 2026

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Keishirou Kumada, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 441 days.

(21) Appl. No.: 18/176,095

(22) Filed: Feb. 28, 2023

(65) Prior Publication Data

US 2023/0326960 A1      Oct. 12, 2023

(30) Foreign Application Priority Data

Apr. 6, 2022     (JP) .................................. 2022-063567

(51) Int. Cl.
*H10D 62/10*           (2025.01)
*H10D 12/01*           (2025.01)
(Continued)

(52) U.S. Cl.
CPC ......... *H10D 62/109* (2025.01); *H10D 12/031* (2025.01); *H10D 30/668* (2025.01);
(Continued)

(58) Field of Classification Search
CPC ............. H01D 30/0297; H10D 62/108; H10D 62/8325; H10D 64/62; H10P 30/2042; H10P 30/21; H10P 30/22
(Continued)

(56) References Cited

U.S. PATENT DOCUMENTS

2011/0068353 A1     3/2011   Nakano
2017/0222046 A1     8/2017   Wakimoto et al.
(Continued)

FOREIGN PATENT DOCUMENTS

JP        2012069933 A      4/2012
JP           5819064 B2    11/2015
(Continued)

OTHER PUBLICATIONS

Office Action of corresponding Japanese Patent Application No. 2022-063567 dated Jan. 6, 2026.
(Continued)

*Primary Examiner* — Fazli Erdem
(74) *Attorney, Agent, or Firm* — Rabin & Berdo, P.C.

(57)          ABSTRACT

A silicon carbide semiconductor device has a silicon carbide semiconductor substrate of a first conductivity type1, a first semiconductor layer of the first conductivity type, a second semiconductor layer of a second conductivity type, first semiconductor regions of the first conductivity type, trenches, gate insulating films, gate electrodes, a first electrode, and a second electrode. The second semiconductor layer has a second semiconductor region of a second conductivity type, an impurity concentration of the second semiconductor region increases in the depth direction, has a maximum value at a predetermined depth, and from the predetermined depth, in the depth direction, decreases; a half-width of the impurity concentration is 0.15 µm or less; and an impurity concentration of the plurality of first semiconductor regions is constant in the depth direction.

12 Claims, 11 Drawing Sheets

(51) Int. Cl.
   *H10D 30/66*     (2025.01)
   *H10D 62/17*     (2025.01)
   *H10D 62/832*     (2025.01)
   *H10P 30/22*     (2026.01)

(52) U.S. Cl.
   CPC ....... *H10D 62/393* (2025.01); *H10D 62/8325* (2025.01); *H10P 30/22* (2026.01)

(58) Field of Classification Search
   USPC ........................................................ 257/77
   See application file for complete search history.

(56)              References Cited

U.S. PATENT DOCUMENTS

| | | | |
|---|---|---|---|
| 2018/0197983 A1 | 7/2018 | Kinoshita et al. | |
| 2019/0074373 A1* | 3/2019 | Kobayashi | H10D 62/157 |
| 2022/0254919 A1* | 8/2022 | Matsunaga | H10D 12/031 |
| 2022/0302251 A1* | 9/2022 | Iwaya | H01L 21/046 |

FOREIGN PATENT DOCUMENTS

| | | |
|---|---|---|
| JP | 2017139441 A | 8/2017 |
| JP | 2019050352 A | 3/2019 |
| WO | 2017/064949 A1 | 4/2017 |

OTHER PUBLICATIONS

Office Action issued for corresponding Japanese Patent Application No. 2022-063567, and its English translation, dated May 26, 2026.

* cited by examiner

FIG.3

| ACCELERATION VOLTAGE OF AI | HALF-WIDTH (μm) |
|---|---|
| 100keV | 0.078 |
| 200keV | 0.132 |
| 300keV | 0.14 |
| 400keV | 0.166 |
| 500keV | 0.173 |
| 600keV | 0.19 |
| 700keV | 0.192 |

FIG.15
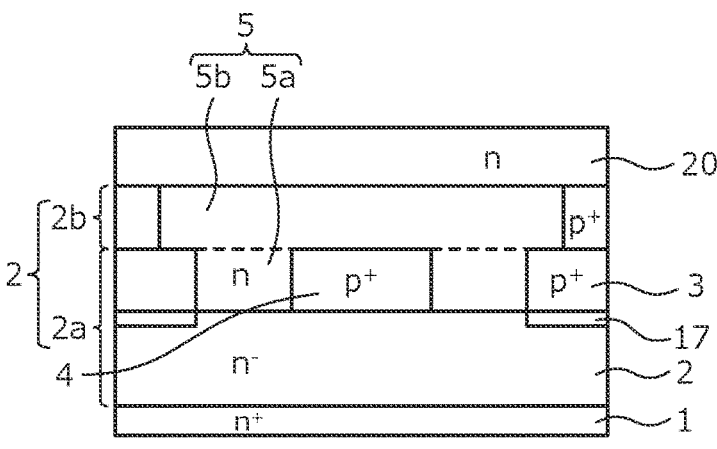
FIG.16
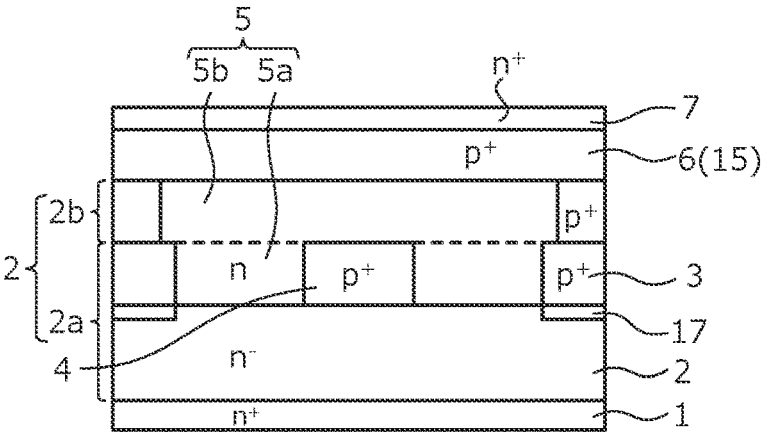
FIG.17

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2022-063567, filed on Apr. 6, 2022, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) is expected to replace silicon (Si) as a next generation semiconductor material. Compared to a conventional semiconductor device element using silicon as a semiconductor material, a semiconductor device element using silicon carbide as a semiconductor material (hereinafter, silicon carbide semiconductor device) has various advantages such as enabling resistance of a device element in an ON state to be reduced to a few hundredths and application under higher temperature (at least 200 degrees C.) environments. These advantages are due to characteristics of the material itself in that a bandgap of silicon carbide is about 3 times larger than that of silicon and dielectric breakdown field strength thereof is nearly an order of magnitude greater than that of silicon.

Up to now, Schottky barrier diodes (SBDs) and vertical metal oxide semiconductor field effect transistors (MOSFETs) having a trench gate structure or planar gate structure have become commercialized as silicon carbide semiconductor devices.

A planar gate structure is a MOS gate structure in which a MOS gate is provided in a flat plate-like shape on a front surface of a semiconductor substrate. A trench gate structure is a MOS gate structure in which a MOS gate is embedded in a trench formed in a semiconductor substrate (semiconductor chip), at a front surface thereof and a channel (inversion layer) is formed along a sidewall of the trench in a direction orthogonal to the front surface of the semiconductor substrate. Therefore, compared to the planar gate structure in which a channel is formed along the front surface of the semiconductor substrate, unit cell (constituent unit of device element) density per unit area as well as current density per unit area may be increased, which are advantageous in terms of cost.

FIG. 18 is a cross-sectional view depicting a structure of a conventional silicon carbide semiconductor device. A trench-type MOSFET 170 is described as an example of the structure of the conventional silicon carbide semiconductor device. In the trench-type MOSFET 170, an n⁻-type silicon carbide epitaxial layer 102 is deposited on a front surface of an n⁺-type silicon carbide substrate 101. In the n⁻-type silicon carbide epitaxial layer 102, at a first surface thereof opposite to a second surface thereof facing the n⁺-type silicon carbide substrate 101, an n-type high-concentration region 105 is provided. In the n-type high-concentration region 105, at the surface thereof, a first p⁺-type base region 103 configured by a lower first p⁺-type base region 103a and an upper first p⁺-type base region 103b is selectively provided between trenches 116. Further, in the n-type high-concentration region 105, second p⁺-type base regions 104 are selectively provided at positions facing bottoms of the trenches 116 in a depth direction.

MOS gates of the trench gate structure are configured by a p-type base layer 106, n⁺-type source regions 107, p⁺-type contact regions 108, the trenches 116, gate insulating films 109, and gate electrodes 110. Hereinafter, the n⁺-type silicon carbide substrate 101, the n⁻-type silicon carbide epitaxial layer 102, the n-type high-concentration region 105, and the p-type base layer 106 combined are regarded as a silicon carbide semiconductor base 118.

Further, an interlayer insulating film 111 is provided on the gate electrodes 110 and a source electrode 112 is provided in contact with the n⁺-type source regions 107 and the p⁺-type contact regions 108 in openings of the interlayer insulating film 111. On the interlayer insulating film 111, a barrier metal 114 that prevents metal atoms from diffusing to the gate electrodes 110 is provided. On a back surface of the n⁺-type silicon carbide substrate 101, a back electrode 113 that constitutes a drain electrode is provided.

In the trench-type MOSFET 170 having this structure, to adjust a threshold voltage (Vth), ion implantation (hereinafter, referred to as "channel implantation") of a p-type impurity such as aluminum (Al) is performed in a portion of the p-type base layer 106 where a channel is to be formed. As a result, a p⁺-type implanted channel region 115 having an impurity concentration that is higher than an impurity concentration of the p-type base layer 106 is formed. In the MOSFET, the higher is the threshold voltage, the lower is the possibility of the MOSFET erroneously turning-on due to electromagnetic noise or the like and thus, due to the channel implantation, electron current penetration becomes less likely, and the threshold voltage (channel inversion voltage) is increased.

Further, in the n⁻-type silicon carbide epitaxial layer 102, at a position deeper than is the first p⁺-type base region 103 between an adjacent two of the trenches 116, an n⁺-type region 117 having a peak impurity concentration that is higher than that of the n-type high-concentration region 105 is provided. A deep position is a position that is closer to the back electrode 113 than is the first p⁺-type base region 103.

Further, a semiconductor device is known in which a p-type semiconductor layer has a channel region, a size of the channel region in the depth direction x is 0.1 μm to 0.5 μm, and the channel region has a high-centration portion in which a peak impurity concentration is about $1 \times 10^{18}$ cm⁻³, whereby all respective values of the on-resistance, the withstand voltage, and the threshold voltage may be set to be relatively favorable values (for example, refer to Japanese Patent No. 5819064).

Further, a semiconductor device is known in which an end of a second base region of a second conductivity type (the end thereof facing a drain electrode) and an end of a first base region of the second conductivity type (the end thereof facing the drain electrode) are set so as to reach a position that is deeper than is an end of a region of a first conductivity type (the end thereof facing the drain electrode), electric field strength of the gate insulating films at trench bottoms is mitigated, and the withstand voltage of an active portion is suppressed, whereby withstand voltage design of the voltage withstanding structure portion may be facilitated (for example, refer to International Publication No. WO 2017/064949).

SUMMARY OF THE INVENTION

According to an embodiment of the invention, a silicon carbide semiconductor device includes: a silicon carbide semiconductor substrate of a first conductivity type, the silicon carbide semiconductor substrate having a first main surface and a second main surface that are opposite to each other; a first semiconductor layer of the first conductivity type, provided on the first main surface of the silicon carbide semiconductor substrate, an impurity concentration of the first semiconductor layer being lower than an impurity concentration of the silicon carbide semiconductor substrate, the first semiconductor layer having a first surface and a second surface that are opposite to each other, the second surface of the first semiconductor layer facing the silicon carbide semiconductor substrate; a second semiconductor layer of a second conductivity type, provided on the first surface of the first semiconductor layer, the second semiconductor layer having a first surface and a second surface that are opposite to each other, the second surface of the second semiconductor layer facing the first semiconductor layer; a plurality of first semiconductor regions of the first conductivity type, selectively provided at the first surface of the second semiconductor layer; a plurality of trenches penetrating through the first semiconductor regions and the second semiconductor layer, and reaching the first semiconductor layer; a plurality of gate insulating films provided in the plurality of trenches, respectively; a plurality of gate electrodes provided on the plurality of gate insulating films in the plurality of gate trenches, respectively; a first electrode in contact with the second semiconductor layer and the plurality of first semiconductor regions; a second electrode provided on the second main surface of the silicon carbide semiconductor substrate; and a second semiconductor region of the second conductivity type, provided in the second semiconductor layer, the second semiconductor region having a first side and a second side that is opposite to the first side and closer to the first surface of the second semiconductor layer than is the first side of the second semiconductor layer. In the second semiconductor region, in a depth direction from the first side toward the second side, an impurity concentration increases from the first side to a predetermined depth from the first side, and decreases from the predetermined depth to the second side, the impurity concentration having a maximum value at the predetermine depth, a half-width of the impurity concentration being 0.15 μm or less, and an impurity concentration of each of the plurality of first semiconductor regions is constant in the depth direction.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a table showing a relationship between ion implantation strength and the half-width based on results in FIG. 2.

FIG. 15 is a cross-sectional view depicting a state of the silicon carbide semiconductor device according to the second embodiment during manufacture.

FIG. 16 is a cross-sectional view depicting a state of the silicon carbide semiconductor device according to the second embodiment during manufacture.

FIG. 17 is a cross-sectional view depicting a state of the silicon carbide semiconductor device according to the second embodiment during manufacture.

DETAILED DESCRIPTION OF THE INVENTION

First, problems associated with the conventional techniques are discussed. In the conventional MOSFET 170, the $p^+$-type implanted channel region 115 and the $n^+$-type source regions 107 are formed by ion implantation. The $n^+$-type source regions 107 are formed by ion implantation and thus, an impurity concentration difference occurs in the depth direction, an n-type impurity, for example, phosphorus (P) also enters deep locations, decrease of the impurity concentration becomes gradual, and the impurity concentration is such that a tail is pulled. Therefore, to form the $p^+$-type implanted channel region 115 in lower portions of the n+-type source regions 107, deep ion implantation is necessary.

Figure 18:
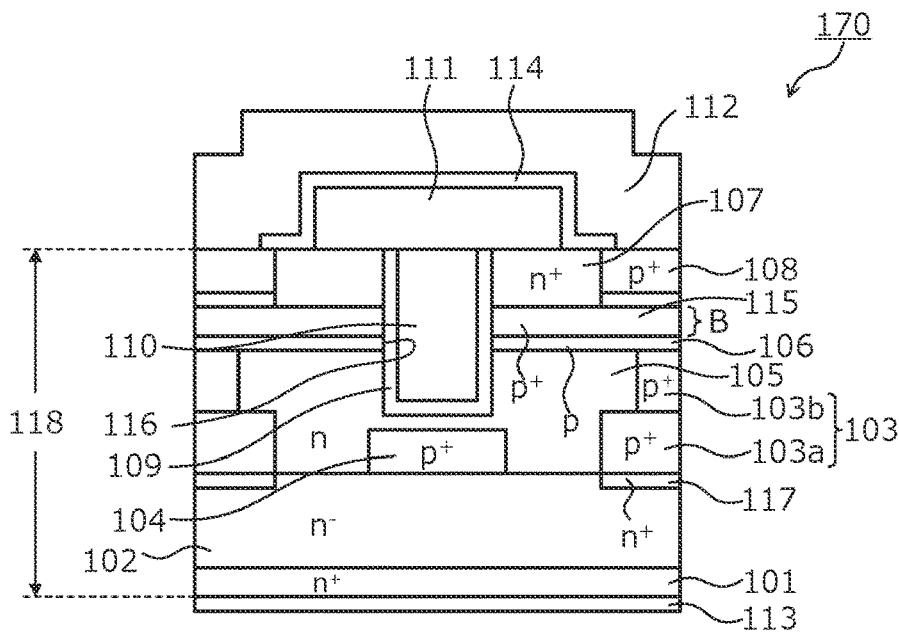
FIG. 18 is a cross-sectional view depicting a structure of a conventional silicon carbide semiconductor device.
Figure 19:
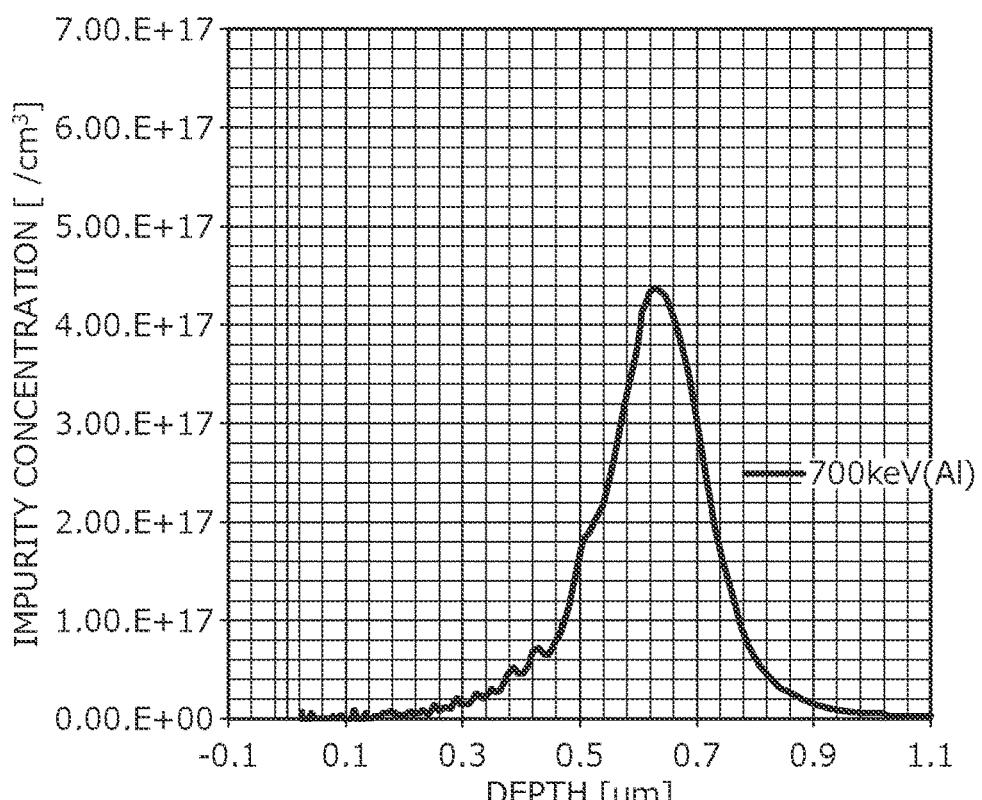
FIG. 19 is a graph depicting impurity concentration distribution of a $p^+$-type implanted channel region of the conventional silicon carbide semiconductor device.

Thus, acceleration voltage during the ion implantation has to be at least 700 keV. FIG. 19 is a graph depicting impurity concentration distribution of the p+-type implanted channel region of the conventional silicon carbide semiconductor device. In FIG. 19, a vertical axis indicates the concentration of the implanted impurity Al (aluminum) in units of /cm³. A horizontal axis therein indicates the depth from the surface of the p+-type implanted channel region 115 in units of μm. FIG. 19 depicts the impurity concentration implanted by the channel implantation in a region indicated by reference character B in FIG. 18. As depicted in FIG. 19, by an acceleration voltage of 700 keV, the p+-type implanted channel region 115 is formed at a deep location, and a half-width of the impurity concentration becomes as large as about 0.192 μm. When the half-width is large, the impurity concentration pulls the tail to the deep side and thus, allowance for a margin in the depth direction of the p+-type implanted channel region 115 is necessary and the thickness of the p-type base layer 106 increases, whereby a problem arises in that the trench-type MOSFET 170 increases in length vertically.

Furthermore, variation of the characteristics of the threshold voltage (Vth) also affects the portion that pulls the tail to the deep side of the p+-type implanted channel region 115 and thus, when the half-width of the impurity concentration widens, variation of Vth increases. Further, when the p+-type implanted channel region 115 is formed by shallow ion implantation to reduce the channel length, a concentration and length of the p+-type implanted channel region 115 necessary to ensure Vth cannot be ensured, whereby a problem arises in that a short channel effect is easily caused and a Vth-RonA (on-resistance) tradeoff is not improved.

Embodiments of a method of manufacturing a silicon carbide semiconductor device and a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

Figure 1:
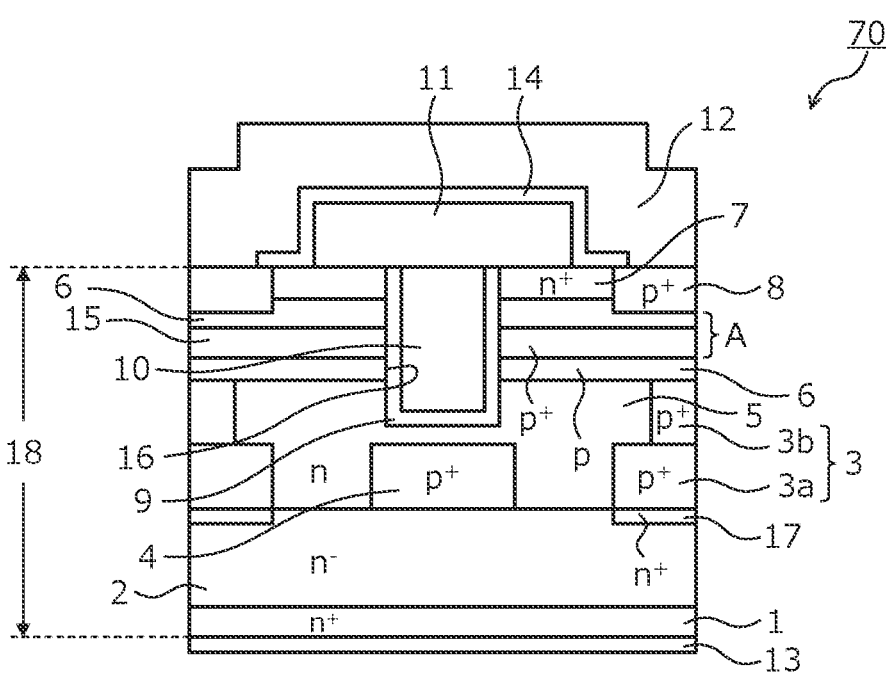
FIG. 1 is a cross-sectional view depicting a structure of a silicon carbide semiconductor device according to a first embodiment.

A semiconductor device according to the present invention contains a wide bandgap semiconductor. In the embodiments, a silicon carbide semiconductor device fabricated (manufactured) using, for example, silicon carbide (SiC) as a wide bandgap semiconductor is described taking a trench-type MOSFET 70 as an example. FIG. 1 is a cross-sectional view depicting a structure of a silicon carbide semiconductor device according to a first embodiment. In FIG. 1, only an active region through which a main current of the trench-type MOSFET 70 flows is depicted.

As depicted in FIG. 1, in the silicon carbide semiconductor device according to the first embodiment, on a first main surface (front surface), for example, a (0001) plane (Si-face) of an n+-type silicon carbide substrate (silicon carbide semiconductor substrate of a first conductivity type) 1, an n⁻-type silicon carbide epitaxial layer (first semiconductor layer of the first conductivity type) 2 is deposited.

The n+-type silicon carbide substrate 1 is a silicon carbide single crystal substrate. The n⁻-type silicon carbide epitaxial layer 2 has an impurity concentration that is lower than an impurity concentration of the n+-type silicon carbide substrate 1 and, for example, is a low-concentration n-type drift layer. In the n⁻-type silicon carbide epitaxial layer 2, at a first surface thereof opposite to a second surface thereof facing the n+-type silicon carbide substrate 1, an n-type high-concentration region 5 is provided. The n-type high-concentration region 5 is a high-concentration n-type drift layer having an impurity concentration that is lower than the impurity concentration of the n+-type silicon carbide substrate 1 but higher than the impurity concentration of the n⁻-type silicon carbide epitaxial layer 2.

On the first surface of the n⁻-type silicon carbide epitaxial layer 2, a p-type base layer (second semiconductor layer of a second conductivity type) 6 is provided. Hereinafter, the n+-type silicon carbide substrate 1, the n⁻-type silicon carbide epitaxial layer 2, the n-type high-concentration region 5, and the p-type base layer 6 combined are assumed as a silicon carbide semiconductor base (semiconductor substrate containing silicon carbide) 18.

On a second main surface (back surface, i.e., a back surface of the silicon carbide semiconductor base 18) of the n+-type silicon carbide substrate 1, a back electrode (second electrode) 13 that constitutes a drain electrode is provided. A drain electrode pad (not depicted) is provided on the surface of the back electrode 13.

In the silicon carbide semiconductor base, at a front surface thereof (side having the p-type base layer 6), a trench structure is formed. In particular, from a first surface (first main surface of silicon carbide semiconductor base) of the p-type base layer 6, opposite to a second surface thereof facing the n+-type silicon carbide substrate 1, trenches 16 penetrate through the p-type base layer 6 and reach the n-type high-concentration region 5 (in an instance in which the n-type high-concentration region 5 is omitted, the n⁻-type silicon carbide epitaxial layer 2, hereinafter, indicated as simply "(2)"). Along inner walls of the trenches 16, the gate insulating films 9 are formed on bottoms and sidewalls of the trenches 16, and gate electrodes 10 are formed on the gate insulating films 9 in the trenches 16, respectively. The gate insulating films 9 insulate the gate electrodes 10 from the n-type high-concentration region 5 (2) and the p-type base layer 6. A portion of each of the gate electrodes 10 may protrude toward a later-described source electrode (first electrode) 12, from an upper portion (side facing the source electrode 12) of each of the trenches 16.

In the n-type high-concentration region 5 (2), at a first surface (surface facing first main surface of the silicon carbide semiconductor base) thereof opposite to a second surface thereof facing the n+-type silicon carbide substrate 1, first p+-type base regions 3 are provided between the trenches 16 that are adjacent to one another. Further, in the n-type high-concentration region 5 (2), second p⁻-type base regions 4 are, respectively, provided at positions facing bottoms of the trenches 16 in the depth direction (direction from the source electrode 12 to the back electrode 13). The first p+-type base regions 3 are configured by lower first p+-type base regions 3a having a thickness that is the same as that of the second p+-type base regions 4 and upper first p+-type base regions 3b that are in contact with the lower first p+-type base regions 3a and the p-type base layer 6. The second p+-type base regions 4 are as wide or wider than the trenches 16. The bottoms of the trenches 16 may reach the second p$^+$-type base regions 4, respectively, or may be positioned in the n-type high-concentration region 5 (2) so as to be between the p-type base layer 6 and the second p$^+$-type base regions 4.

Further, in the n$^-$-type silicon carbide epitaxial layer 2, at positions deeper than are the first p$^+$-type base regions 3 between the trenches 16, n$^+$-type regions 17 having a peak impurity concentration that is higher than that of the n-type high-concentration region 5 (2) are provided. A deep position is a position that is closer to the back electrode 13 than are the first p$^+$-type base regions 3.

In the p-type base layer 6, to adjust the threshold voltage (Vth), ion implantation is performed in a portion of the p-type base layer 6 where a channel is to be formed. As a result, a p$^+$-type implanted channel region (second semiconductor region of a second conductivity type) 15 having an impurity concentration that is higher than that of the p-type base layer 6 is formed.

In the p-type base layer 6, n$^+$-type source regions (first semiconductor regions of the first conductivity type) 7 are selectively provided at the first main surface of the silicon carbide semiconductor base 18. Further, p$^+$-type contact regions (third semiconductor regions of the second conductivity type) 8 may be selectively provided. Further, the n$^+$-type source regions 7 and the p$^+$-type contact regions 8 are in contact with one another. In the first embodiment, the n$^+$-type source regions 7 are formed by epitaxial growth as described hereinafter. Therefore, the n$^+$-type source regions 7 have a constant impurity concentration in the depth direction. The n$^+$-type source regions 7 have an impurity concentration that is higher than the impurity concentration of the n$^-$-type silicon carbide epitaxial layer 2. Further, the p$^+$-type contact regions 8 have an impurity concentration that is higher than the impurity concentrations of the p-type base layer 6 and the p$^+$-type implanted channel region 15.

The p-type base layer 6 is formed by epitaxial growth as described hereinafter and a p-type impurity such as aluminum is ion-implanted in the p-type base layer 6, whereby the p$^+$-type implanted channel region 15 is formed. At this time, the p-type base layer 6 is formed thinly in a range of 0.3 µm to 0.7 µm and thus, the ion implantation is performed by a low acceleration voltage of 300 keV or less.

Figure 2:
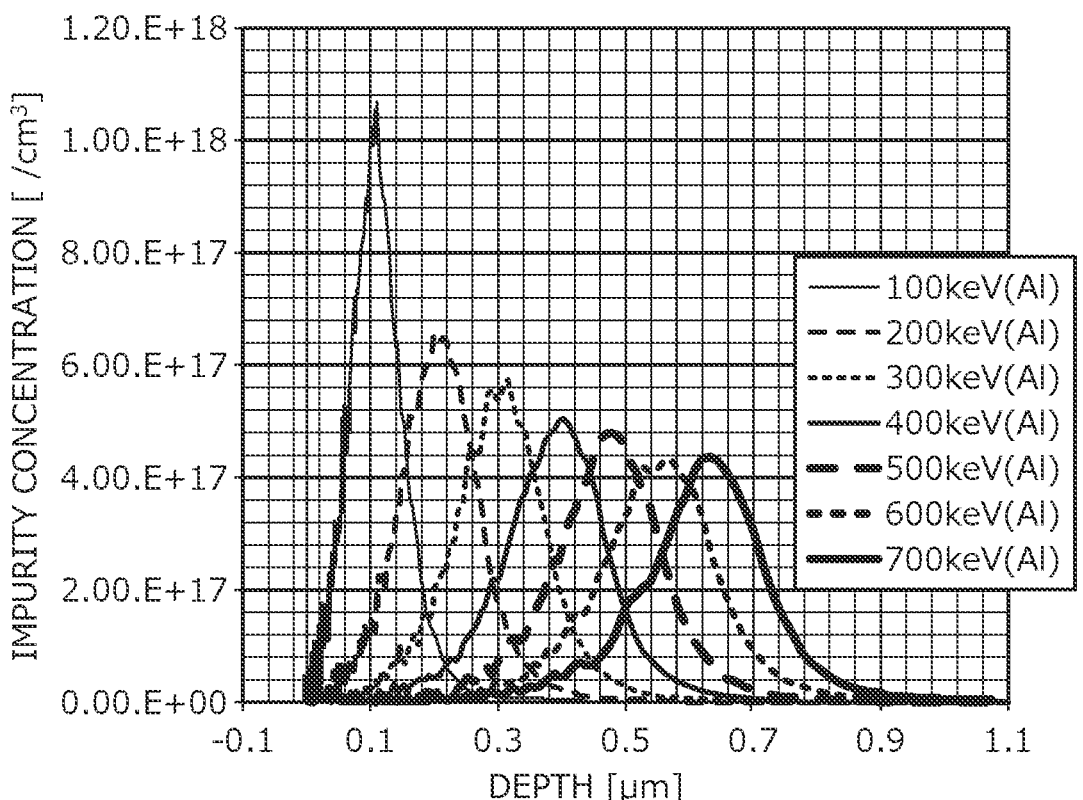
FIG. 2 is a graph depicting a relationship between ion implantation strength and half-width.

Here, FIG. 2 is a graph depicting a relationship between ion implantation strength and the half-width. In FIG. 2, a vertical axis indicates the concentration of the implanted impurity Al (aluminum) in units of /cm$^3$. A horizontal axis indicates depth from the surface in units of µm. FIG. 2 depicts the Al concentration in instances in which the ion implantation strength is varied from 100 keV to 700 keV. FIG. 3 is a table showing the relationship between the ion implantation strength and the half-width based on the results in FIG. 2. The half-width is the width between the depths where the concentration of the impurity is half of the peak value.

As depicted in FIGS. 2 and 3, the lower is the acceleration voltage of the ion implantation, the higher is the peak value of the impurity concentration and the smaller is the half-width. From FIG. 3, it is found that when the acceleration voltage of the ion implantation is 300 keV or less, the half-width is 0.15 µm or less.

Figure 4:
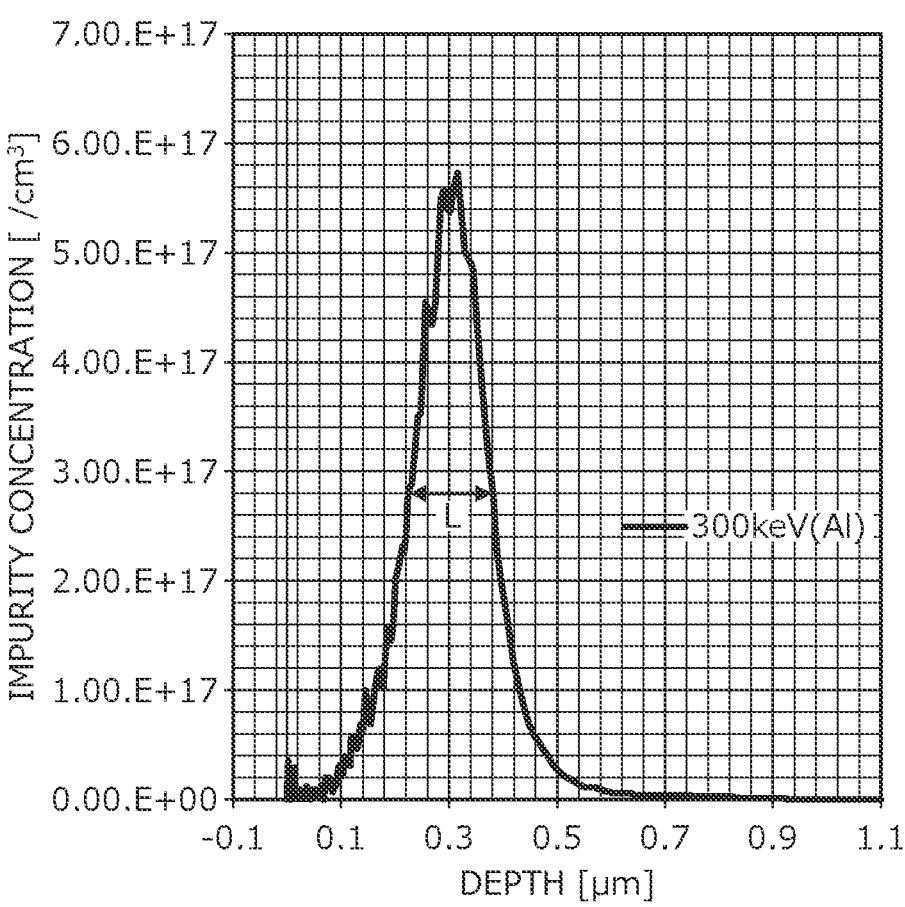
FIG. 4 is a graph depicting impurity concentration distribution of a $p^+$-type implanted channel region of the silicon carbide semiconductor device according to the first embodiment.

FIG. 4 is a graph depicting the impurity concentration distribution of the p$^+$-type implanted channel region of the silicon carbide semiconductor device according to the first embodiment. In FIG. 4, a vertical axis indicates the concentration of the implanted impurity Al (aluminum) in units of /cm$^3$. A horizontal axis indicates depth from the surface of the p-type base layer 6 in units of µm. FIG. 4 shows the impurity concentration of a region indicated by reference character A in FIG. 1, implanted by the channel implantation. In other words, the impurity concentration of the p-type base layer 6 is not included. In the first embodiment, formation of the p$^+$-type implanted channel region 15 is performed by an acceleration voltage of 300 keV or less. Therefore, as depicted in FIG. 4, in the p$^+$-type implanted channel region 15, the impurity concentration increases as the depth increases and at a certain depth, the impurity concentration peaks and then in the depth direction, the impurity concentration decreases; and the half-width of the p-type impurity concentration L is at most 0.15 µm.

Further, the n$^+$-type source regions 7 are formed thinly in a range of 0.1 µm to 0.3 µm by epitaxial growth. As a result, in the depth direction as well, a constant, high concentration may be maintained. The p$^+$-type contact regions 8 are formed by ion implantation in the thinly formed n$^+$-type source regions 7 and thus, the p$^+$-type contact regions 8 have a thickness that is in a range of 0.2 µm to 0.4 µm and thicker than that of the n$^+$-type source regions 7. The impurity concentration of the n$^+$-type source regions 7 is in a range of $1\times10^{18}$/cm$^3$ to $5\times10^{19}$/cm$^3$. The impurity concentration of the p$^+$-type contact regions 8 is higher than that of the n$^+$-type source regions 7 and in a range between $1\times10^{19}$/cm$^3$ and $5\times10^{20}$/cm$^3$.

Figure 5:
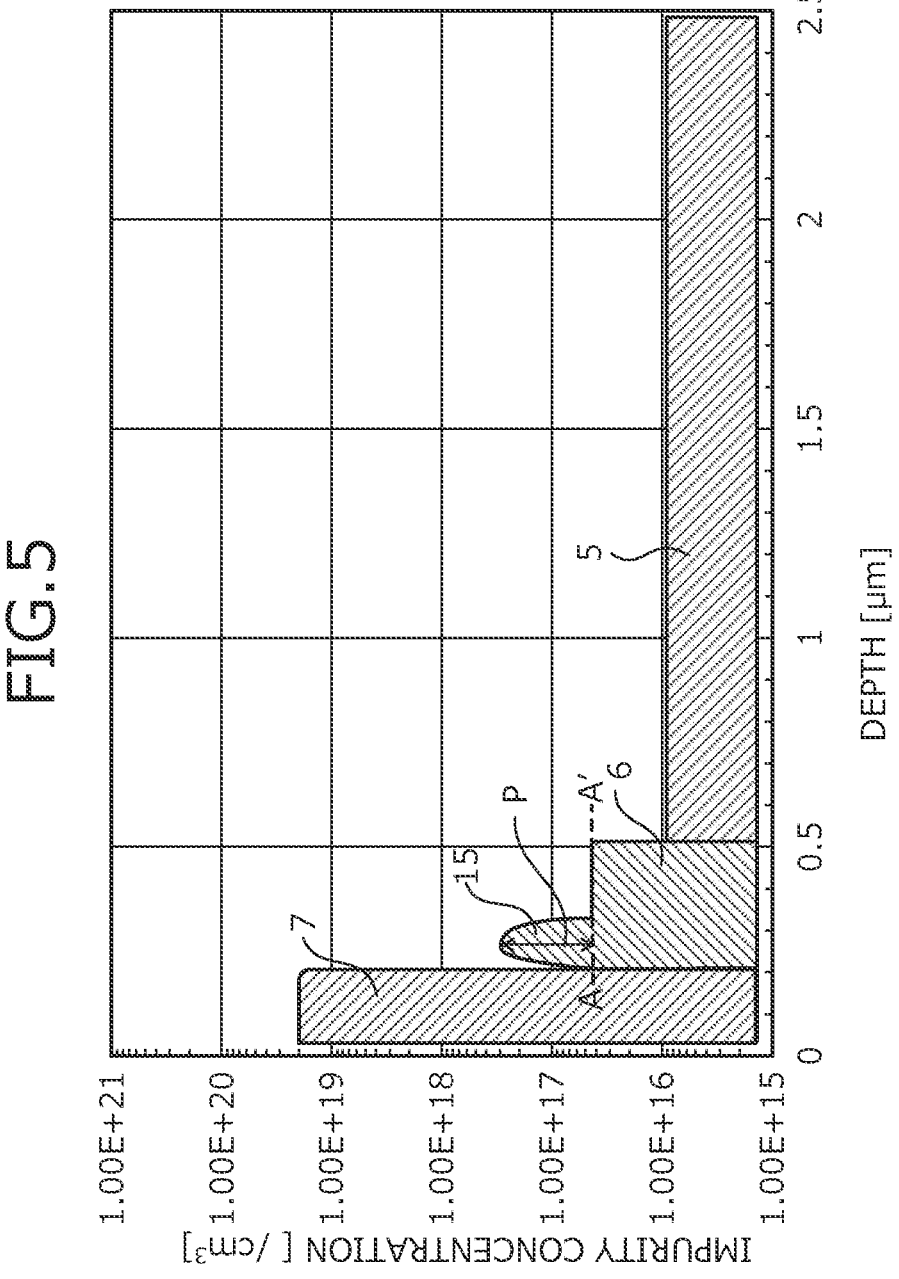
FIG. 5 is a graph depicting an impurity concentration distribution of $n^+$-type source regions, a p-type base layer, the $p^+$-type implanted channel region, and a n-type high-concentration region of the silicon carbide semiconductor device according to the first embodiment.

FIG. 5 is a graph depicting an impurity concentration distribution of the n$^+$-type source regions, the p-type base layer, the p$^+$-type implanted channel region, and the n-type high-concentration region of the silicon carbide semiconductor device according to the first embodiment. In FIG. 5, a vertical axis indicates impurity concentration in units of /cm$^3$. A horizontal axis indicates depth from the surface of the n$^+$-type source region 7 in units of µm. For the n$^+$-type source regions 7 and the n-type high-concentration region 5 (2), the n-type impurity concentration is shown and for the p$^+$-type implanted channel region 15 and the p-type base layer 6, the p-type impurity concentration is shown. In FIG. 5, interfaces between the p$^+$-type implanted channel region 15 and the n$^+$-type source regions 7 are surfaces where the surface of the p$^+$-type implanted channel region 15 and surfaces of the n$^+$-type source regions 7 intersect; similarly for an interface between the p-type base layer 6 and the n-type high-concentration region 5 (2), and for interfaces in later-described FIG. 14.

In FIG. 5, the impurity implanted by the channel implantation is indicated by a region where the impurity concentration is higher than a dashed line A-A' in FIG. 5 while an impurity by epitaxial growth is indicated by a region where the impurity concentration is lower than the dashed line A-A' in FIG. 5. The half-width of the p$^+$-type implanted channel region 15 is the width (distance) between the depths where the impurity ion-implanted by the channel implantation for forming the p$^+$-type implanted channel region 15 is half of a peak impurity concentration P. Further, as depicted in FIG. 5, the channel implantation is performed by an acceleration voltage of 300 keV or less and thus, the p$^+$-type implanted channel region 15 is formed at a shallow position (position relatively close the n$^+$-type source regions 7) in the p-type base layer 6. The n$^+$-type source regions 7 are formed by epitaxial growth and have a thickness of 0.2 µm.

In this manner, in the first embodiment, the n$^+$-type source regions 7 are formed by epitaxial growth and thus, at interface portions between the p$^+$-type implanted channel region 15 and the n$^+$-type source regions 7, the impurity concentration of the n$^+$-type source regions 7 is sharp and not such that the tail is pulled in the depth direction; and when the p$^+$-type implanted channel region 15 is formed, it is unnecessary to implant a p-type impurity deeper than is necessary.

As a result, the half-width of the impurity concentration of the p$^+$-type implanted channel region 15 is 0.15 μm or less and narrow, and formation with a high impurity concentration is possible. Thus, a margin of the p$^+$-type implanted channel region 15 in the depth direction is unnecessary, the thickness of the p-type base layer 6 may be reduced, and a height of the trench-type MOSFET 70 may be reduced. Furthermore, threshold variation and RonA variation improve, and the Vth-RonA tradeoff may be improved.

In this manner, in the silicon carbide semiconductor device of the first embodiment, variation of RonA and the threshold also improves and thus, the Vth-RonA tradeoff also improves, whereby in instances in which there are many parallel connections on chips of a large capacitance module, unbalance between chips connected in parallel may be reduced. Thus, the load between devices due to a high-speed SW is equalized, and malfunctioning and damage to a particular chip are eliminated, thereby enabling realization of a highly reliable product.

Furthermore, in the first embodiment, the n$^+$-type source regions 7 are formed by epitaxial growth and therefore, have a constant impurity concentration in the depth direction. Ion implantation of an impurity in the n$^+$-type source regions 7 is unnecessary and therefore, without defects due to ion implantation, sheet resistance and contact resistance may be reduced. Further, variation in the ease of implantation (channeling, etc.) dependent on crystal orientation during ion implantation is eliminated, whereby a constant, high impurity concentration may be maintained in the depth direction as well.

An interlayer insulating film 11 is provided in an entire area of the front surface of the silicon carbide semiconductor base 18, so as to cover the gate electrodes 10 embedded in the trenches 16. The source electrode 12 is in contact with the n$^+$-type source regions 7 and the p-type base layer 6, via contact holes opened in the interlayer insulating film 11. Further, in an instance in which the p$^+$-type contact regions 8 are provided, the source electrode 12 is in contact with the n$^+$-type source regions 7 and the p$^+$-type contact regions 8. The source electrode 12 is electrically insulated from the gate electrodes 10 by the interlayer insulating film 11. On the source electrode 12, a source electrode pad (not depicted) is provided. Between the source electrode 12 and the interlayer insulating film 11, for example, a barrier metal 14 that prevents diffusion of metal atoms from the source electrode 12 to the gate electrodes 10 may be provided.

Next, a method of manufacturing the silicon carbide semiconductor device according to the first embodiment is described. FIGS. 6, 7, 8, 9, 10, 11, and 12 are cross-sectional views depicting states of the silicon carbide semiconductor device according to the first embodiment during manufacture. First, the n$^+$-type silicon carbide substrate 1 containing an n-type silicon carbide is prepared.

Figure 6:
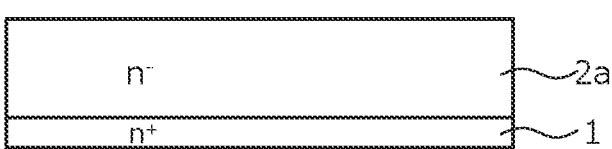
FIG. 6 is a cross-sectional view depicting a state of the silicon carbide semiconductor device according to the first embodiment during manufacture.

Subsequently, on the first main surface of the n$^+$-type silicon carbide substrate 1, a lower n$^-$-type silicon carbide epitaxial layer 2a containing silicon carbide is epitaxially grown while an n-type impurity, for example, nitrogen atoms (N), is doped; the lower n$^-$-type silicon carbide epitaxial layer 2a has a thickness of, for example, about 30 μm. The state up to here is depicted in FIG. 6.

Next, on the surface of the lower n$^-$-type silicon carbide epitaxial layer 2a, a non-depicted mask having predetermined openings is formed by photolithography, using, for example, an oxide film. Subsequently, by an ion implantation method using the oxide film as a mask, an n-type impurity, for example, nitrogen atoms, may be ion-implanted. As a result, the n$^+$-type regions 17 are formed in the lower n$^-$-type silicon carbide epitaxial layer 2a.

Next, the mask used during the ion implantation for forming the n$^+$-type regions 17 is removed. Next, an ion implantation mask having predetermined openings is formed by photolithography, using, for example, an oxide film. Subsequently, a p-type impurity such as aluminum is implanted in the openings of the oxide film, thereby forming the lower first p$^+$-type base regions 3a and the second p$^+$-type base regions 4 at a depth of about 0.5 μm. In an instance in which the n$^+$-type regions 17 are formed, on first surfaces of the n$^+$-type regions 17 opposite to second surfaces thereof facing the n$^+$-type silicon carbide substrate 1, the lower first p$^+$-type base regions 3a are formed so as to overlap the n$^+$-type regions 17, respectively.

Figure 7:
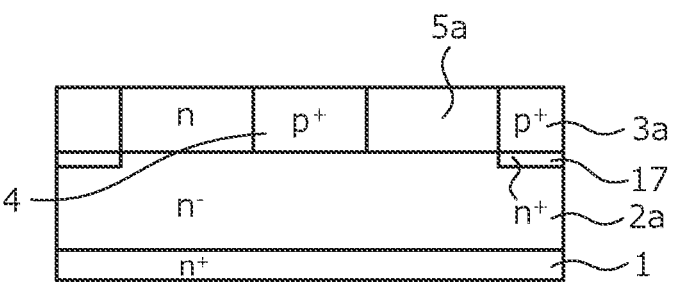
FIG. 7 is a cross-sectional view depicting a state of the silicon carbide semiconductor device according to the first embodiment during manufacture.

Next, the ion implantation mask is partially removed, an n-type impurity such as nitrogen is ion-implanted in the openings, whereby in the lower n$^-$-type silicon carbide epitaxial layer 2a, at the surface thereof, lower n-type high-concentration regions 5a may be formed to a depth of, for example, about 0.5 μm. An impurity concentration of the lower n-type high-concentration regions 5a is set to, for example, about $1\times10^{17}$/cm$^3$. The state up to here is depicted in FIG. 7.

Next, on the surface of the lower n$^-$-type silicon carbide epitaxial layer 2a, an upper n$^-$-type silicon carbide epitaxial layer 2b doped with an n-type impurity such as nitrogen is formed having a thickness of about 0.5 μm. An impurity concentration of the upper n$^-$-type silicon carbide epitaxial layer 2b is set so as to become about $3\times10^{15}$/cm$^3$. Hereinafter, the lower n$^-$-type silicon carbide epitaxial layer 2a and the upper n$^-$-type silicon carbide epitaxial layer 2b combined constitute the n$^-$-type silicon carbide epitaxial layer 2.

Next, on the surface of the upper n$^-$-type silicon carbide epitaxial layer 2b, an ion implantation mask having predetermined openings is formed by photolithography, using, for example, an oxide film. Subsequently, a p-type impurity such as aluminum is implanted in the openings of the oxide film, thereby forming the upper first p$^+$-type base regions 3b to a depth of about 0.5 μm, so as to overlap the lower first p$^+$-type base regions 3a, respectively. The upper first p$^+$-type base regions 3b and the lower first p$^+$-type base regions 3a form connected regions, respectively, constituting the first p$^+$-type base regions 3. An impurity concentration of the upper first p$^+$-type base regions 3b is set so as to become, for example, about $5\times10^{18}$/cm$^3$.

Figure 8:
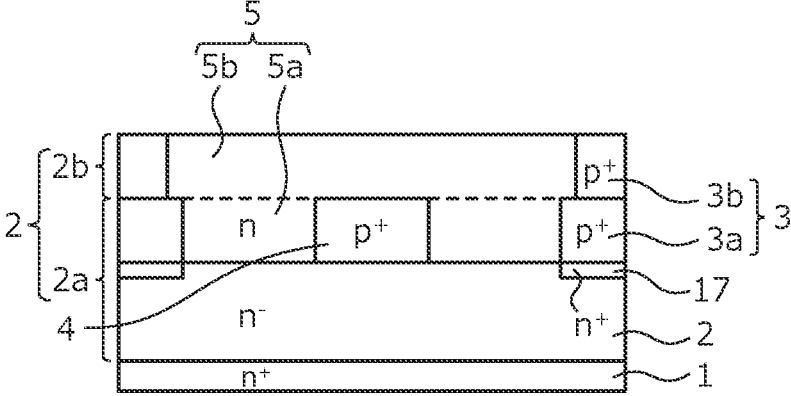
FIG. 8 is a cross-sectional view depicting a state of the silicon carbide semiconductor device according to the first embodiment during manufacture.
Figure 9:
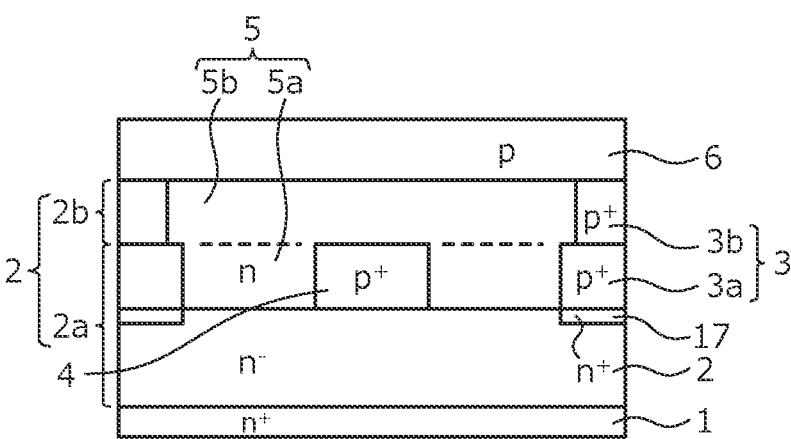
FIG. 9 is a cross-sectional view depicting a state of the silicon carbide semiconductor device according to the first embodiment during manufacture.

Next, the ion implantation mask is partially removed, an n-type impurity such as nitrogen is ion-implanted in the openings, and upper n-type high-concentration regions 5b may be formed to a depth of, for example, about 0.5 μm in the n$^-$-type silicon carbide epitaxial layer 2, at the surface thereof. An impurity concentration of the upper n-type high-concentration regions 5b is set to, for example, about $1\times10^{17}$/cm$^3$. The upper n-type high-concentration regions 5b and the lower n-type high-concentration regions 5a are formed so as to at least partially contact one another and thereby, form the n-type high-concentration region 5. Nonetheless, the n-type high-concentration region 5 may be formed at the entire substrate surface or may be omitted. The state up to here is depicted in FIG. 8.

Next, on the surface of the n$^-$-type silicon carbide epitaxial layer 2, the p-type base layer 6 is formed by epitaxially growth and has a thickness in a range of 0.3 μm to 0.7 μm. An impurity concentration of the p-type base layer 6 is set to about $4\times10^{16}$/cm$^3$. The state up to here is depicted in FIG.

Figure 10:
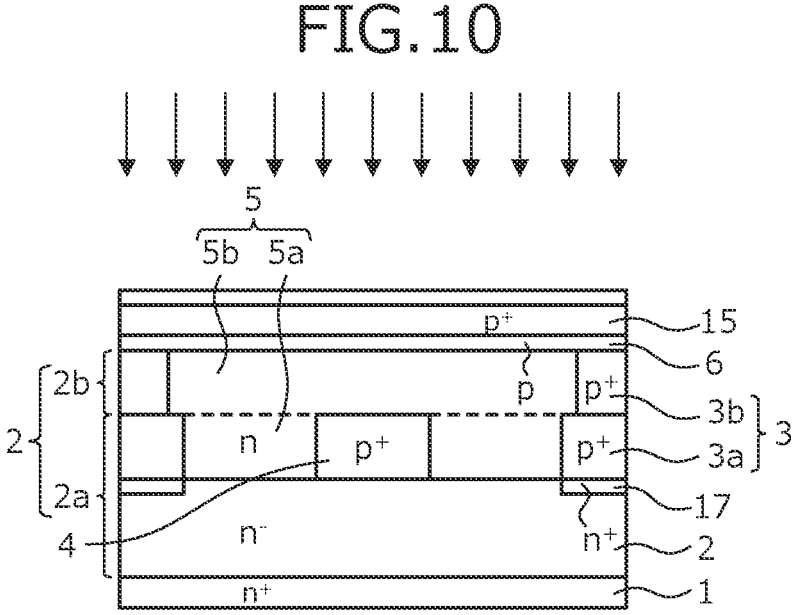
FIG. 10 is a cross-sectional view depicting a state of the silicon carbide semiconductor device according to the first embodiment during manufacture.

9. Thereafter, in the p-type base layer 6, a p-type impurity such as aluminum is ion-implanted by a low acceleration voltage of in a range of 100 keV to 300 keV, whereby the $p^+$-type implanted channel region 15 is formed. As a result, the $p^+$-type implanted channel region 15 is formed at a shallow position in the p-type base layer 6, whereby the p-type half-width of the impurity concentration may be set to be 0.15 μm or less. The state up to here is depicted in FIG. 10.

Figure 11:
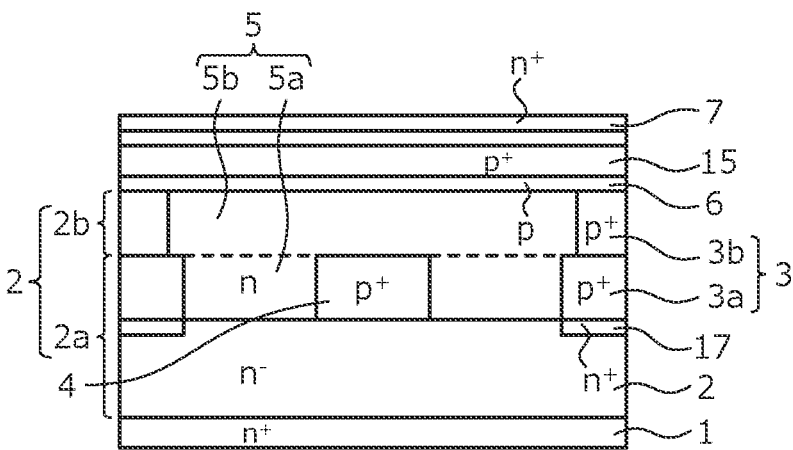
FIG. 11 is a cross-sectional view depicting a state of the silicon carbide semiconductor device according to the first embodiment during manufacture.

Next, on the silicon carbide semiconductor base 18, at the first main surface thereof (surface of the p-type base layer 6), predetermined regions configuring the MOS gates are formed. In particular, on the surface of the p-type base layer 6, the $n^+$-type source regions 7 are formed by epitaxially growth while an n-type impurity, for example, nitrogen atoms (N), is doped, the $n^+$-type source regions 7 each having a thickness in a range of 0.1 μm to 0.3 μm. The impurity concentration of the $n^+$-type source regions 7 is set to be about $2 \times 10^{19}/cm^3$. The state up to here is depicted in FIG. 11.

Here, while the $n^+$-type source regions 7 are formed after the $p^+$-type implanted channel region 15 is formed, the $p^+$-type implanted channel region 15 may be formed in the p-type base layer 6 by ion-implanting a p-type impurity such as aluminum by a low acceleration voltage in a range of 100 keV to 300 keV, after the $n^+$-type source regions 7 are formed on the p-type base layer 6 by epitaxially growth. In this instance, the ion implantation is performed penetrating through the $n^+$-type source regions 7 and thus, the acceleration voltage has to be increased as compared to an instance of ion implantation on the surface of the p-type base layer 6. Therefore, it may be preferable to form the $n^+$-type source regions 7 after the $p^+$-type implanted channel region 15 is formed.

Further, the $n^+$-type source regions 7 may be formed by ion implantation. In particular, on the surface of the p-type base layer 6, an ion implantation mask having predetermined openings is formed by photolithography, using, for example, an oxide film. In the openings, an n-type impurity such as nitrogen (N), phosphorus (P), or the like is ion-implanted, thereby forming the $n^+$-type source regions 7 in portions of the p-type base layer 6, at the surface thereof. Next, the ion implantation mask used to form the $n^+$-type source regions 7 is removed.

Figure 12:
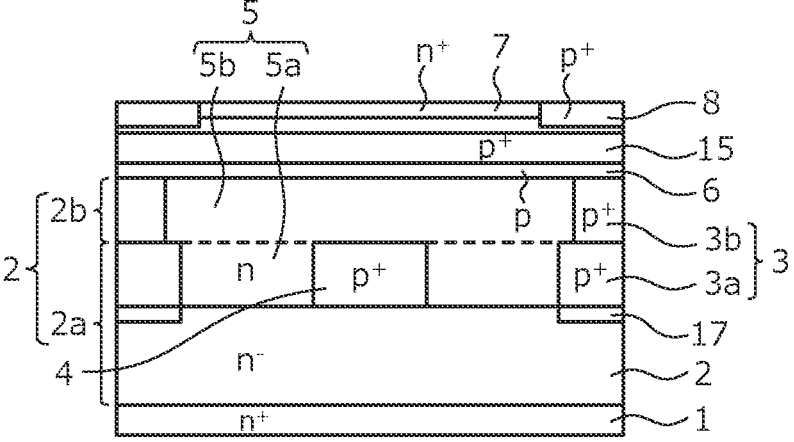
FIG. 12 is a cross-sectional view depicting a state of the silicon carbide semiconductor device according to the first embodiment during manufacture.

Next, on the $n^+$-type source regions 7, an ion implantation mask having predetermined openings is formed by photolithography, using, for example, an oxide film. In the openings, a p-type impurity such as aluminum is ion-implanted, thereby forming in the $n^+$-type source regions 7, at the surfaces thereof, the $p^+$-type contact regions 8. The $p^+$-type contact regions 8 are formed having a greater thickness than that of the $n^+$-type source regions 7 to ensure that lower surfaces of the $p^+$-type contact regions 8 reach the p-type base layer 6. The impurity concentration of the $p^+$-type contact regions 8 is set to be higher than the impurity concentration of the p-type base layer 6. Next, the ion implantation mask used to form the $p^+$-type contact regions 8 is removed. The state up to here is depicted in FIG. 12.

Next, a heat treatment (activation annealing) for activating all regions formed by ion implantation is performed. For example, an activation treatment for the first $p^+$-type base regions 3, the second $p^+$-type base regions 4, the $p^+$-type implanted channel region 15, the $p^+$-type contact regions 8, and the $n^+$-type regions 17 is implemented by performing a heat treatment (annealing) under an inert gas atmosphere of about 1700 degrees C. The ion-implanted regions may be collectively activated by a single heat treatment as described above or may be activated by performing the heat treatment each time ion implantation is performed.

Next, on the $n^+$-type source regions 7, a trench formation mask having predetermined openings is formed by photolithography, using, for example, an oxide film. Next, the trenches 16, which penetrate through the $n^+$-type source regions 7 and the p-type base layer 6 and reach the n-type high-concentration region 5 (2), are formed by dry etching. The bottoms of the trenches 16 may reach the second $p^+$-type base regions 4 formed in the n-type high-concentration region 5 (2). Next, the trench formation mask is removed. Next, the front surface of the silicon carbide semiconductor base 18 is cleaned by, for example, RCA cleaning (wet cleaning using a strong acid and a high base solution).

Next, the gate insulating films 9 are formed along the surfaces of the $n^+$-type source regions 7, and the bottoms and sidewalls of the trenches 16. Next, on the gate insulating films 9, a polycrystalline silicon layer doped with, for example, phosphorus atoms is provided. The polycrystalline silicon layer may be formed so as to be embedded in the trenches 16. The polycrystalline silicon layer is patterned by photolithography so as to be left in the trenches 16, whereby the gate electrodes 10 are formed.

Next, for example, a phosphate glass is deposited so as to cover the gate insulating films 9 and the gate electrodes 10 and have a thickness of about 1 μm, whereby the interlayer insulating film 11 is formed. Next, the barrier metal 14 containing titanium (Ti) or titanium nitride (TiN) may be formed so as to cover the interlayer insulating film 11. The interlayer insulating film 11 and the gate insulating films 9 are patterned by photolithography, whereby contact holes that expose the $n^+$-type source regions 7 and the $p^+$-type contact regions 8 are formed. Thereafter, a heat treatment (reflow) is performed, thereby planarizing the interlayer insulating film 11.

Next, the interlayer insulating film 11 is selectively removed and a nickel (Ni) or Ti film is deposited on the surface of the silicon carbide semiconductor base 1. Next, the surface is protected and on the back surface of the $n^+$-type silicon carbide substrate 1, a Ni or Ti film is deposited. Next, a heat treatment of about 1000 degrees C. is performed, whereby ohmic electrodes are formed on the front side of the silicon carbide semiconductor base 18 and on the back side of the $n^+$-type silicon carbide substrate 1.

Next, a conductive film constituting the source electrode 12 is provided so as to be in contact with the ohmic electrode portions formed in the contact holes and to be on the interlayer insulating film 11, whereby the $n^+$-type source regions 7 and the $p^+$-type contact regions 8 are in contact with the source electrode 12.

Next, on the second main surface of the $n^+$-type silicon carbide substrate 1, for example, the back electrode 13 constituted by a nickel (Ni) film is formed. Thereafter, for example, a heat treatment is performed at a temperature of about 1000 degrees C., whereby the $n^+$-type silicon carbide substrate 1 and the back electrode 13 are in ohmic contact.

Next, for example, by a sputtering method, on the source electrode 12 at the front surface of the silicon carbide semiconductor base 18 and in the openings of the interlayer insulating film 11, an electrode pad constituting the source electrode pad (not depicted) is deposited. A portion of the electrode pad on the interlayer insulating film 11 may have a thickness of, for example, 5 μm. The electrode pad, for example, may be formed by aluminum (Al—Si) that contains silicon at a ratio of 1%. Next, the source electrode pad is selectively removed.

Next, for example, titanium (Ti), nickel (Ni), and gold (Au) are sequentially deposited on the surface of the back electrode 13, as the drain electrode pad (not depicted). Thus, as described above, the silicon carbide semiconductor device depicted in FIG. 1 is completed.

As described above, according to the first embodiment, formation of the p$^+$-type implanted channel region is performed by an acceleration voltage of 300 keV or less. As a result, in the p$^+$-type implanted channel region, the half-width of the p-type impurity concentration is 0.15 μm or less. Thus, allowance of a margin for the p$^+$-type implanted channel region in the depth direction is unnecessary and the thickness of the p-type base layer may be reduced, whereby the height of the trench-type MOSFET may be reduced. Furthermore, threshold variation and RonA variation are improved and thus, the Vth-RonA tradeoff may be improved.

Figure 13:
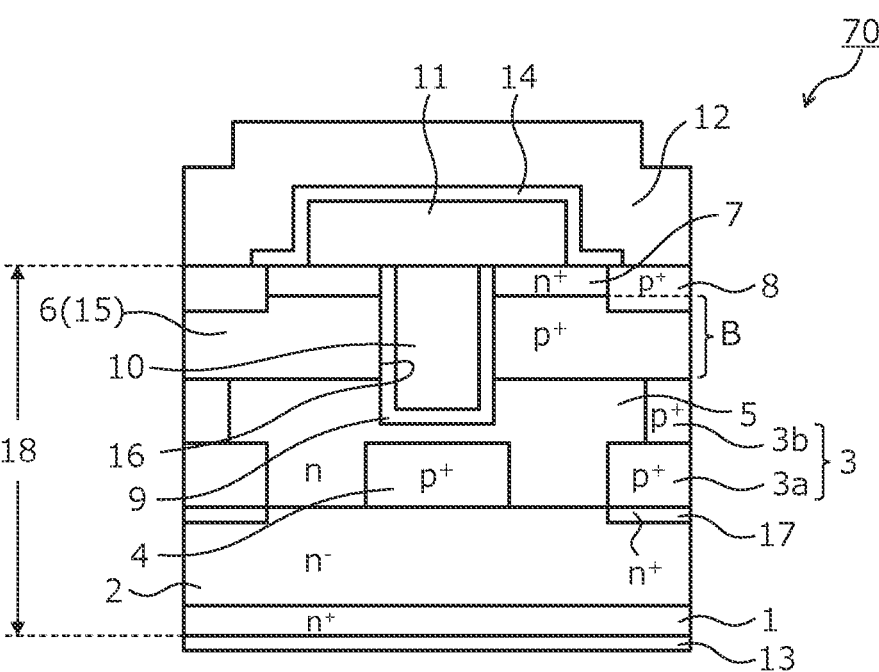
FIG. 13 is a cross-sectional view depicting a structure of a silicon carbide semiconductor device according to a second embodiment.

FIG. 13 is a cross-sectional view depicting a structure of a silicon carbide semiconductor device according to a second embodiment. The silicon carbide semiconductor device according to the second embodiment differs from the silicon carbide semiconductor device according to the first embodiment in that the p-type base layer 6 is entirely occupied by the p$^+$-type implanted channel region 15, and the p$^+$-type implanted channel region 15 is in contact with the n-type high-concentration region 5 (2) and the n$^+$-type source regions 7. Therefore, in the second embodiment, the p$^+$-type implanted channel region 15 also serves as the p-type base layer 6.

As described hereinafter, in this structure, an n-type epitaxial layer 20 is formed on the n-type high-concentration region 5 (2), a p-type impurity such as aluminum is ion-implanted in the n-type epitaxial layer 20, and the n-type is inverted to a p-type, whereby the p$^+$-type implanted channel region 15 is formed. At this time, similarly to the first embodiment, the n-type epitaxial layer 20 that constitutes the p$^+$-type implanted channel region 15 is formed thinly in a range of 0.3 μm to 0.7 μm and thus, ion implantation is performed by a low acceleration voltage of 300 keV or less.

The impurity concentration distribution of the p$^+$-type implanted channel region 15 of the silicon carbide semiconductor device according to the second embodiment is the same as the impurity concentration distribution of the p-type base layer 6 of the first embodiment (refer to FIG. 4). In the second embodiment, the impurity concentration is that of a region indicated by reference character B in FIG. 13. In the second embodiment as well, the ion implantation is performed by an acceleration voltage of 300 keV or less and therefore, as depicted in FIG. 4, the half-width L of the p-type impurity in the p$^+$-type implanted channel region 15 is 0.15 μm or less.

Figure 14:
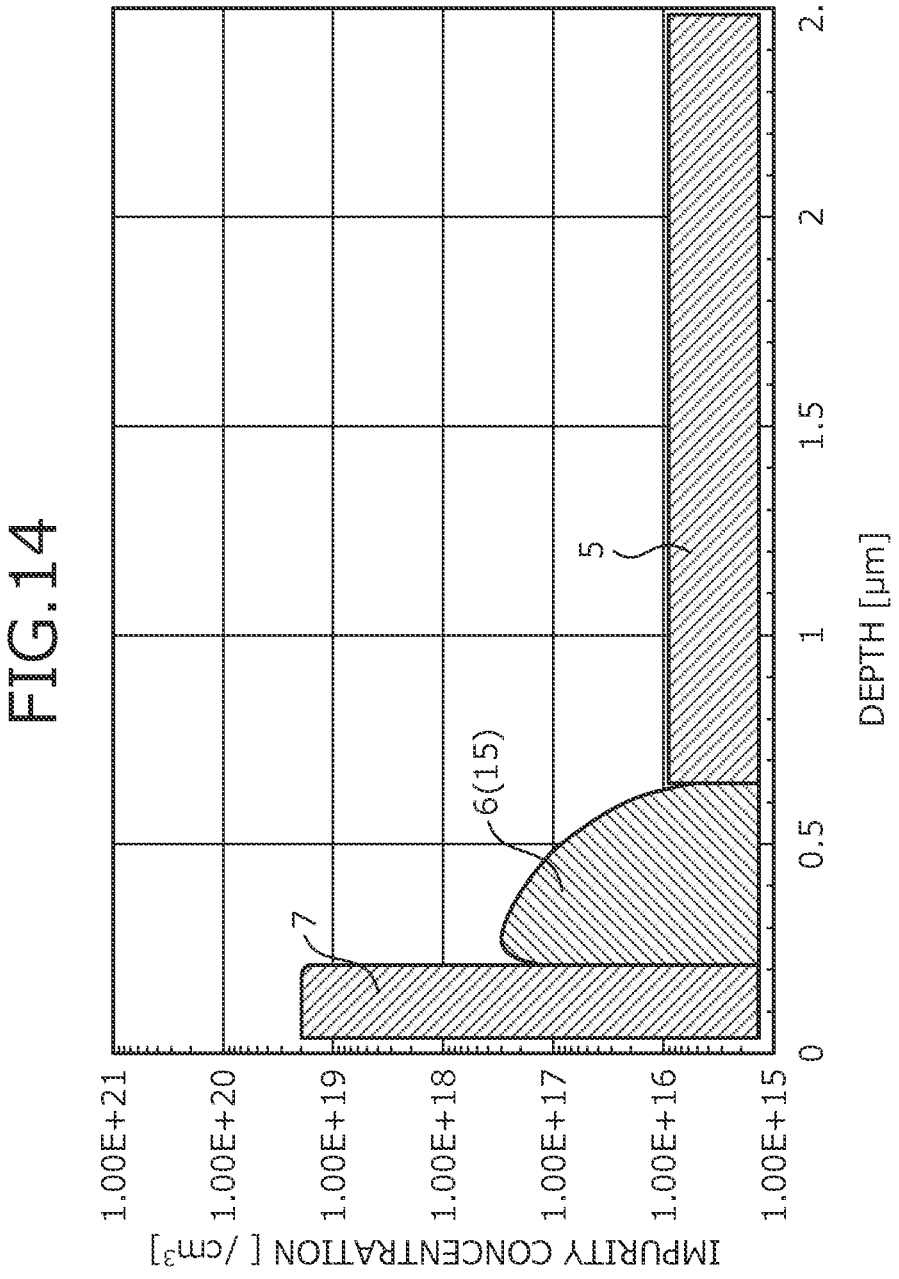
FIG. 14 is a graph depicting impurity concentration distribution of the $n^+$-type source regions, the $p^+$-type implanted channel region (p-type base layer), and the n-type high-concentration region of the silicon carbide semiconductor device according to the second embodiment.

FIG. 14 is a graph depicting impurity concentration distribution of the n$^+$-type source regions, the p$^+$-type implanted channel region (p-type base layer), and the n-type high-concentration region of the silicon carbide semiconductor device according to the second embodiment. In FIG. 14, a vertical axis indicates the concentration of the implanted impurity in units of /cm$^3$. A horizontal axis indicates depth from the surface of the n$^+$-type source region 7 in units of μm. For the n$^+$-type source regions 7 and the n-type high-concentration region 5 (2), the n-type impurity concentration is shown and for the p$^+$-type implanted channel region 15 (the p-type base layer 6), the p-type impurity concentration is shown. As depicted in FIG. 14, the ion implantation is performed by an acceleration voltage of 300 keV or less and therefore, the p$^+$-type implanted channel region 15 is formed having a peak impurity concentration at a position (the n$^+$-type source regions 7 side) close to the n$^+$-type source regions 7. Further, the n$^+$-type source regions 7 are formed by epitaxially growth and have a thickness of 0.2 μm.

In the second embodiment as well, the n$^+$-type source regions 7 are formed by epitaxial growth and therefore, at the interface portions between the p$^+$-type implanted channel region 15 and the n$^+$-type source regions 7, the phenomenon of the impurity concentration of the n$^+$-type source regions 7 pulling a tail in the depth direction is eliminated. Thus, when the p$^+$-type implanted channel region 15 is formed, it is unnecessary to implant a p-type impurity deeper than is necessary, and effects similar to those of the first embodiment are obtained.

Next, a method of manufacturing the silicon carbide semiconductor device according to the second embodiment is described. FIGS. 15, 16, and 17 are cross-sectional views depicting states of the silicon carbide semiconductor device according to the second embodiment during manufacture. First, similarly to the first embodiment, the n$^+$-type silicon carbide substrate 1 containing an n-type silicon carbide is prepared.

Thereafter, from the process of epitaxially growing the lower n$^-$-type silicon carbide epitaxial layer 2a to the process of forming the n-type high-concentration region 5 are performed similarly as in the first embodiment (refer to FIGS. 6 to 8).

Next, on the surface of the n$^-$-type silicon carbide epitaxial layer 2, the n-type epitaxial layer 20 is formed by epitaxially growth and has a thickness in a range of 0.3 μm to 0.7 μm. The state up to here is depicted in FIG. 15. Thereafter, a p-type impurity such as aluminum is ion-implanted in the n-type epitaxial layer 20 by a low acceleration voltage in a range of 100 keV to 300 keV, whereby the n-type is inverted into a p-type, whereby the p$^+$-type implanted channel region 15, which also serves as the p-type base layer 6 is formed. The p$^+$-type implanted channel region 15 may be formed by multiple sessions of the ion implantation. For example, ion implantation of a high dose amount by a low acceleration voltage and ion implantation of a low dose by a high acceleration voltage may be combined. Further, the first p$^+$-type base regions 3, the second p$^+$-type base regions 4, the n$^+$-type regions 17, the n-type high-concentration region 5, etc. may be formed after the n-type epitaxial layer 20 is formed. The state up to here is depicted in FIG. 16.

Next, in the silicon carbide semiconductor base 18, at the first main surface thereof (in a surface layer of the p-type base layer 6), predetermined regions configuring the MOS gates are formed. In particular, on the surface of the p$^+$-type implanted channel region 15, the n$^+$-type source regions 7 are formed having a thickness in a range of 0.1 μm to 0.3 μm by epitaxially growth. The impurity concentration of the n$^+$-type source regions 7 is set to be about $2\times10^{19}$/cm$^3$. The state up to here is depicted in FIG. 17.

Here, while the n$^+$-type source regions 7 are formed after the p$^+$-type implanted channel region 15 is formed, the p$^+$-type implanted channel region 15 may be formed by ion-implanting a p-type impurity such as aluminum in the n-type epitaxial layer 20 by a low acceleration voltage in a range of 100 keV to 300 keV after the n$^+$-type source regions 7 are formed on the n-type epitaxial layer 20 by epitaxial growth. In this instance, the ion implantation penetrates through the n$^+$-type source regions 7 and therefore, the acceleration voltage has to be increased compared to an instance of ion implantation at the surface of the n-type epitaxial layer 20. Therefore, preferably, the n⁺-type source regions 7 may be formed after the p⁺-type implanted channel region 15 is formed.

Further, the n⁺-type source regions 7 may be formed by ion implantation. In particular, on the surface of the p⁺-type implanted channel region 15, an ion implantation mask having predetermined openings is formed by photolithography, using, for example, an oxide film. In the openings, an n-type impurity such as nitrogen (N), phosphorus (P), or the like is ion-implanted, whereby the n⁺-type source regions 7 are formed in portions of the p⁺-type implanted channel region 15. Next, the ion implantation mask used to form the n⁺-type source regions 7 is removed.

Thereafter, the process of forming the p⁺-type contact regions 8 in the n⁺-type source regions 7, at the surfaces thereof and subsequent processes are performed similarly as in the first embodiment, whereby the silicon carbide semiconductor device depicted in FIG. 1 is completed.

As described above, according to the second embodiment, similarly to the first embodiment, formation of the p⁺-type implanted channel region is performed by an acceleration voltage of 300 keV or less. As a result, in the p⁺-type implanted channel region, the half-width of the p-type impurity concentration is 0.15 μm or less. Thus, effects similar to those of the first embodiment are achieved.

In the foregoing, the present invention may be variously modified within a range not departing from the spirit of the invention and in the described embodiments, for example, dimensions, impurity concentration, etc. of regions may be variously set according to necessary specifications. Further, in the described embodiments, while an instance in which silicon carbide is used as a wide bandgap semiconductor is described as an example, other than silicon carbide, for example, a wide bandgap semiconductor such as gallium nitride (GaN) is applicable. Further, a semiconductor other than a wide bandgap semiconductor, such as silicon (Si), germanium (Ge), etc. is applicable. Further, in the embodiments, while the first conductivity type is an n-type and the second conductivity type is a p-type, the present invention is similarly implemented when the first conductivity type is a p-type and the second conductivity type is an n-type.

According to the described invention, formation of the p⁺-type implanted channel region (second semiconductor region of the second conductivity type) is performed by an acceleration voltage of 300 keV or less. As a result, in the p⁺-type implanted channel region, the half-width of the p-type impurity concentration is 0.15 μm or less. Thus, allowance of a margin for the p⁺-type implanted channel region in the depth direction is unnecessary and thickness of the p-type base layer (second semiconductor layer of the second conductivity type) may be reduced and thus, the height of the trench-type MOSFET may be reduced. Furthermore, the threshold variation and the RonA variation are improved and thus, the Vth-RonA tradeoff may be improved.

The silicon carbide semiconductor device and the method of manufacturing a silicon carbide semiconductor device according to the present invention improve variation of the threshold voltage and the tradeoff between the threshold voltage and the on-resistance may also be improved.

As described, the method of manufacturing a silicon carbide semiconductor device and the silicon carbide semiconductor device according to the present invention are useful for power semiconductor devices used in power converting equipment such as inverters, power supply devices of various types of industrial machines, automotive igniters, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:

a silicon carbide semiconductor substrate of a first conductivity type, the silicon carbide semiconductor substrate having a first main surface and a second main surface that are opposite to each other;

a first semiconductor layer of the first conductivity type, provided on the first main surface of the silicon carbide semiconductor substrate, an impurity concentration of the first semiconductor layer being lower than an impurity concentration of the silicon carbide semiconductor substrate, the first semiconductor layer having a first surface and a second surface that are opposite to each other, the second surface of the first semiconductor layer facing the silicon carbide semiconductor substrate;

a second semiconductor layer of a second conductivity type, provided on the first surface of the first semiconductor layer, the second semiconductor layer having a first surface and a second surface that are opposite to each other, the second surface of the second semiconductor layer facing the first semiconductor layer;

a plurality of first semiconductor regions of the first conductivity type, selectively provided at the first surface of the second semiconductor layer;

a plurality of trenches penetrating through the first semiconductor regions and the second semiconductor layer, and reaching the first semiconductor layer;

a plurality of gate insulating films provided in the plurality of trenches, respectively;

a plurality of gate electrodes provided on the plurality of gate insulating films in the plurality of gate trenches, respectively;

a first electrode in contact with the second semiconductor layer and the plurality of first semiconductor regions;

a second electrode provided on the second main surface of the silicon carbide semiconductor substrate; and a second semiconductor region of the second conductivity type, provided in the second semiconductor layer, the second semiconductor region having a first side and a second side that is opposite to the first side and closer to the second surface of the second semiconductor layer than is the first surface of the second semiconductor layer, wherein:

(i) with respect to a depth direction orthogonal to the first main surface from the first side toward the second side, the first side of the second semiconductor region is positioned at or below a position of the first surface of the second semiconductor layer, and the second side of the second semiconductor region is positioned at or above a position of the second surface of the second semiconductor layer, (ii) in the second semiconductor region, an impurity concentration of the second conductivity type along a vertical cross-section in the depth direction increases from the first side to a predetermined depth, and decreases from the predetermined depth to the second side, and the impurity concentration has a maximum value along the vertical cross section at the predetermined depth in the depth direction orthogonal to the first main surface, and (iii) a half-width of the impurity concentration is 0.15 μm or less, and an impurity concentration of each of the plurality of first semiconductor regions is constant in the depth direction.

2. The silicon carbide semiconductor device according to claim 1, wherein the second semiconductor region is provided in the second semiconductor layer, closer to the first surface of the second semiconductor layer than to the second surface of the second semiconductor layer.

3. The silicon carbide semiconductor device according to claim 1, wherein the second semiconductor layer is the second semiconductor region.

4. The silicon carbide semiconductor device according to claim 3, wherein the predetermined depth at which the impurity concentration of the second semiconductor region has the maximum value is located closer to the first surface of the second semiconductor layer than to the second surface of the second semiconductor layer.

5. The silicon carbide semiconductor device according to claim 1, wherein a thickness of the second semiconductor layer is in a range of 0.3 μm to 0.7 μm.

6. The silicon carbide semiconductor device according to claim 1, wherein a thickness of each of the plurality of first semiconductor regions is in a range of 0.1 μm to 0.3 μm.

7. The silicon carbide semiconductor device according to claim 1, further comprising a plurality of third semiconductor regions of the second conductivity type, selectively provided at the first surface of the second semiconductor layer, an impurity concentration of the plurality of third semiconductor regions being higher than the impurity concentration of the second semiconductor layer, wherein a thickness of each of the plurality of third semiconductor regions is greater than a thickness of each of the plurality of first semiconductor regions.

8. The silicon carbide semiconductor device according to claim 1, wherein the second semiconductor region is in direct contact with sidewalls of the plurality of trenches.

9. A method of manufacturing the silicon carbide semiconductor device according to claim 1, the method comprising: preparing the silicon carbide semiconductor substrate; forming the first semiconductor layer on the first main surface of the silicon carbide semiconductor substrate; forming the second semiconductor layer on the first surface of the first semiconductor layer; selectively forming the plurality of first semiconductor regions at the first surface of the second semiconductor layer; forming the plurality of trenches penetrating through the first semiconductor regions and the second semiconductor layer, and reaching the first semiconductor layer; forming, in the plurality of trenches, respectively, the plurality of gate insulating films along bottoms and sidewalls of the plurality of trenches; forming the plurality of gate electrodes on the plurality of gate insulating films in the trenches, respectively; forming the first electrode on the plurality of first semiconductor regions and the second semiconductor layer; and forming the second electrode on the second main surface of the silicon carbide semiconductor substrate, wherein forming the second semiconductor layer includes implanting therein an impurity of the second conductivity type by an acceleration voltage in a range of 100keV to 300keV, thereby forming the second semiconductor region of the second conductivity type, in which in a depth direction of the second semiconductor region from an upper side toward a bottom side of the second semiconductor region, the impurity concentration increases from the upper side to the predetermined depth from the upper side, and decreases from the predetermined depth to the bottom side, the impurity concentration of the second semiconductor region having the maximum value at the predetermined depth, andthe plurality of first semiconductor regions are epitaxially grown.

10. The method according to claim 9, wherein forming the second semiconductor layer includes epitaxially growing the second semiconductor layer, and implanting the impurity in the second semiconductor layer, thereby forming the second semiconductor region.

11. The method according to claim 9, wherein forming the second semiconductor layer includes epitaxially growing another semiconductor layer of the first conductivity type on the first surface of the first semiconductor layer, and implanting the impurity in the another semiconductor layer, thereby to form the second semiconductor layer and the second semiconductor region.

12. The method according to claim 9, further comprising selectively forming in the second semiconductor layer, at the first surface thereof, a plurality of third semiconductor regions of the second conductivity type, an impurity concentration of the plurality of third semiconductor regions being higher than an impurity concentration of the second semiconductor layer, wherein the plurality of third semiconductor regions are formed to be thicker than the first semiconductor regions.

* * * * *